United States Patent
Kouno

(10) Patent No.: US 10,062,753 B2
(45) Date of Patent: Aug. 28, 2018

(54) SEMICONDUCTOR DEVICE

(71) Applicant: DENSO CORPORATION, Kariya, Aichi-pref. (JP)

(72) Inventor: Kenji Kouno, Kariya (JP)

(73) Assignee: DENSO CORPORATION, Kariya (JP)

( * ) Notice: Subject to any disclaimer, the term of this patent is extended or adjusted under 35 U.S.C. 154(b) by 89 days.

(21) Appl. No.: 15/264,951

(22) Filed: Sep. 14, 2016

(65) Prior Publication Data

US 2017/0084610 A1  Mar. 23, 2017

(30) Foreign Application Priority Data

Sep. 17, 2015  (JP) ................................. 2015-184084

(51) Int. Cl.
| | |
|---|---|
| H01L 29/66 | (2006.01) |
| H01L 29/08 | (2006.01) |
| H01L 29/06 | (2006.01) |
| H01L 29/32 | (2006.01) |
| H01L 29/861 | (2006.01) |
| H01L 29/739 | (2006.01) |
| H01L 27/07 | (2006.01) |

(Continued)

(52) U.S. Cl.
CPC ...... *H01L 29/0804* (2013.01); *H01L 27/0727* (2013.01); *H01L 29/0619* (2013.01); *H01L 29/0696* (2013.01); *H01L 29/32* (2013.01); *H01L 29/7397* (2013.01); *H01L 29/861* (2013.01); *H01L 21/263* (2013.01); *H01L 29/1095* (2013.01)

(58) Field of Classification Search
CPC ............. H01L 29/0804; H01L 27/0727; H01L 29/0696; H01L 21/263; H01L 29/0619; H01L 29/1095; H01L 29/32; H01L 29/7397; H01L 29/861
USPC ........................................................ 257/140
See application file for complete search history.

(56) References Cited

U.S. PATENT DOCUMENTS

| | | | |
|---|---|---|---|
| 2008/0093697 A1* | 4/2008 | Kaneda | H01L 29/0834 257/492 |
| 2008/0217649 A1* | 9/2008 | Arai | H01L 29/7397 257/139 |
| 2012/0132955 A1 | 5/2012 | Saito et al. | |

(Continued)

FOREIGN PATENT DOCUMENTS

| | | |
|---|---|---|
| JP | 2008-192737 A | 8/2008 |
| WO | 2015/145929 A1 | 10/2015 |

*Primary Examiner* — Duy T Nguyen
(74) *Attorney, Agent, or Firm* — Posz Law Group, PLC

(57) ABSTRACT

A semiconductor device includes a semiconductor substrate having a drift layer, a base layer, a collector layer and a cathode layer. The semiconductor substrate includes a cell region and an outer peripheral region surrounding the cell region. The cell region includes an IGBT region and a diode region. The semiconductor substrate further includes a damage region arranged in the diode region and a part of the outer peripheral region adjacent to a boundary between the outer peripheral region and the diode region. A length, in a longitudinal direction of the diode region, of the part of the outer peripheral region, in which the damage region is arranged, is equal to or more than twice of a thickness of the semiconductor substrate. As a result, recovery characteristic is improved in a portion of the diode region adjacent to the boundary between the outer peripheral region and the diode region.

9 Claims, 12 Drawing Sheets

(51) Int. Cl.
*H01L 29/10* (2006.01)
*H01L 21/263* (2006.01)

(56) References Cited

U.S. PATENT DOCUMENTS

| | | | |
|---|---|---|---|
| 2013/0009205 A1* | 1/2013 | Tsuzuki | H01L 29/7397 |
| | | | 257/140 |
| 2015/0228717 A1* | 8/2015 | Hara | H01L 29/0626 |
| | | | 257/140 |
| 2017/0077216 A1 | 3/2017 | Kouno | |

* cited by examiner

IGBT REGION | DIODE REGION
1a | 1b

SEMICONDUCTOR DEVICE

CROSS REFERENCE TO RELATED APPLICATION

This application is based on Japanese Patent Application No. 2015-184084 filed on Sep. 17, 2015, the disclosure of which is incorporated herein by reference.

TECHNICAL FIELD

The present disclosure relates to a semiconductor device having an IGBT region, in which an insulated gate bipolar transistor (IGBT) is arranged, and a diode region, in which a freewheeling diode (FWD) is arranged.

BACKGROUND

For a switching element employed in an inverter or the like, it is conventionally proposed a semiconductor device having an IGBT region, in which an IGBT element is arranged, and a diode region, in which a diode element is arranged (for example, see JP 2008492737 A).

Specifically, in the semiconductor device, a base layer is arranged at a surface layer portion of a semiconductor substrate providing an N$^-$ type drift layer. A trench gate structure is arranged to pass through the base layer. On a rear surface of the semiconductor substrate, a P type collector layer and an N type cathode layer are arranged. An N type emitter region is arranged at a portion of the base layer located above the collector layer.

On a front surface of the semiconductor substrate, an upper electrode, which is electrically connected to the base layer and the emitter region, is arranged. On the rear surface of the semiconductor substrate, a lower electrode, which is electrically connected to the collector layer and the cathode layer, is arranged.

That is, the IGBT region corresponds to a region in which the collector layer is arranged on the rear surface of the semiconductor substrate, and the diode region corresponds to a region in which the cathode layer is arranged on the rear surface of the semiconductor substrate. In other words, in the above semiconductor device, a boundary between the collector layer and the cathode layer corresponds to a boundary between the IGBT region and the diode region.

The IGBT region and the diode region are repeated alternately in one direction along a plane of the semiconductor substrate. The IGBT region and the diode region extend along a longitudinal direction perpendicular to the one direction in which the IGBT region and the diode region are repeated.

At a surface layer portion of the diode region of the semiconductor substrate, a damage region is arranged. The damage region is formed by irradiating He-ray to an entire surface of the semiconductor substrate.

In the above semiconductor device, a hole of the drift layer (i.e., an excess carrier) is recombined with an electron and eliminated in the damage region during the recovery time of the diode element. Therefore, the excess carrier, which causes a reverse current flowing to the diode element during the recovery time, is reduced, and the reverse current is decreased. Accordingly, a recovery characteristic of the diode element is improved.

SUMMARY

In the above semiconductor device, however, a hole that flows from the IGBT region (i.e., IGBT element) to the diode region (i.e., diode element) during the recovery time is not blocked. There is a possibility that the recovery characteristic is decreased especially at each end of the diode region in the longitudinal direction.

That is, when the IGBT region and the diode region are defined as a cell region, there is a possibility that the recovery characteristic is decreased at a boundary region between the cell region and an outer peripheral region surrounding the cell region.

In the present disclosure, the phrase "recovery characteristic is decreased" means that the recovery current is increased, that recovery loss is increased, and that recovery resistance is decreased.

It is an object of the present disclosure to provide a semiconductor device capable of improving a recovery characteristic at a boundary region between a diode region and an outer peripheral region.

According to an aspect of the present disclosure, a semiconductor device includes a semiconductor substrate having a drift layer, a base layer, a collector layer and a cathode layer. The drift layer has a first conductivity type. The base layer has a second conductivity type and is arranged on the drift layer. The collector layer has the second conductivity type. The cathode layer has the first conductivity type. The collector layer and the cathode layer are arranged opposite to the base layer with respect to the drift layer.

The semiconductor substrate includes a cell region and an outer peripheral region surrounding the cell region. The cell region includes an IGBT region operating as an IGBT element, and a diode region operating as a diode element. The IGBT region and the diode region are alternately repeated in the cell region.

The collector layer is arranged in the IGBT region and the cathode layer is arranged in the diode region. A boundary between the IGBT region and the diode region is defined by a boundary between the collector layer and the cathode layer. The collector layer is arranged in the outer peripheral region and is in contact with the cathode layer A boundary between the outer peripheral region and the diode region of the cell region is defined by the boundary between the collector layer and the cathode layer.

The semiconductor substrate further includes a damage region arranged in a surface layer portion of the semiconductor substrate. The damage region is arranged in the diode region and a part of the outer peripheral region adjacent to the boundary between the outer peripheral region and the diode region.

When a direction in which the diode region and the IGBT region are repeated is defined as an arrangement direction, and a direction perpendicular to the arrangement direction is defined as a longitudinal direction of the diode region, a length, in the longitudinal direction of the diode region, of the part of the outer peripheral region, in which the damage region is arranged, is equal to or more than twice of a thickness of the semiconductor substrate.

As described above, the damage region is arranged in the part of the outer peripheral region adjacent to the boundary between the outer peripheral region and the diode region, and the length, in the longitudinal direction of the diode region, of the part of the outer peripheral region, in which the damage region is arranged, is equal to or more than twice of the thickness of the semiconductor substrate.

As a result, a hole is restricted from being inserted from the outer peripheral region to the diode region, and a recovery characteristic is improved in a portion of the diode region adjacent to the boundary between the outer peripheral region and the diode region.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

Hereinafter, embodiments of the present disclosure will be described with reference to the drawings. In the embodiments, same or equivalent parts will be designated with the same symbols.

(First Embodiment)

A first embodiment of the present disclosure will be described. For example, a semiconductor device of the present embodiment is employed as a power switching element of a power source circuit such as an inverter, a direct current (DC)/DC converter and the like.

Figure 1:
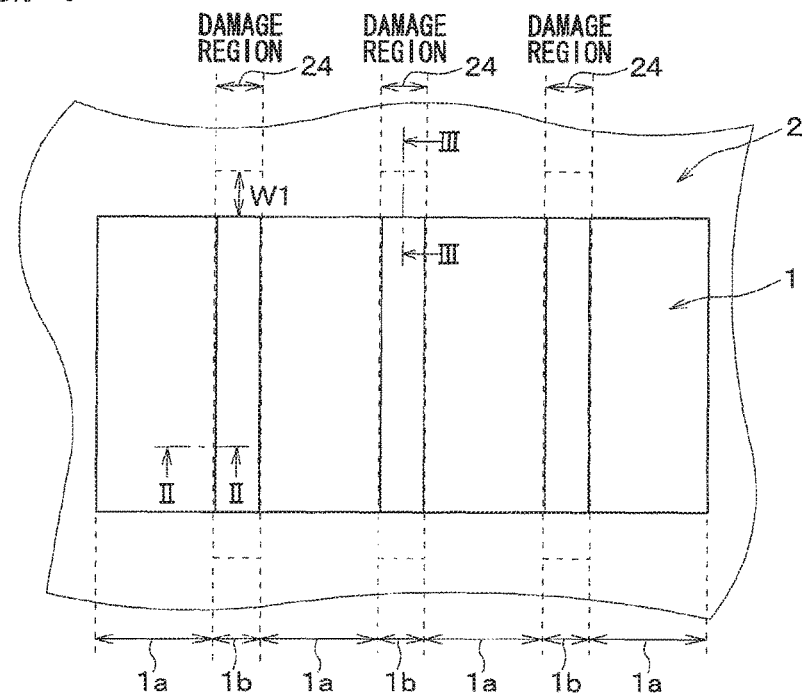
FIG. 1 is a schematic plan view of a semiconductor device according to a first embodiment.

As shown in FIG. 1, the semiconductor device includes a cell region 1 and an outer peripheral region 2 surrounding the cell region 1.

Figure 2:
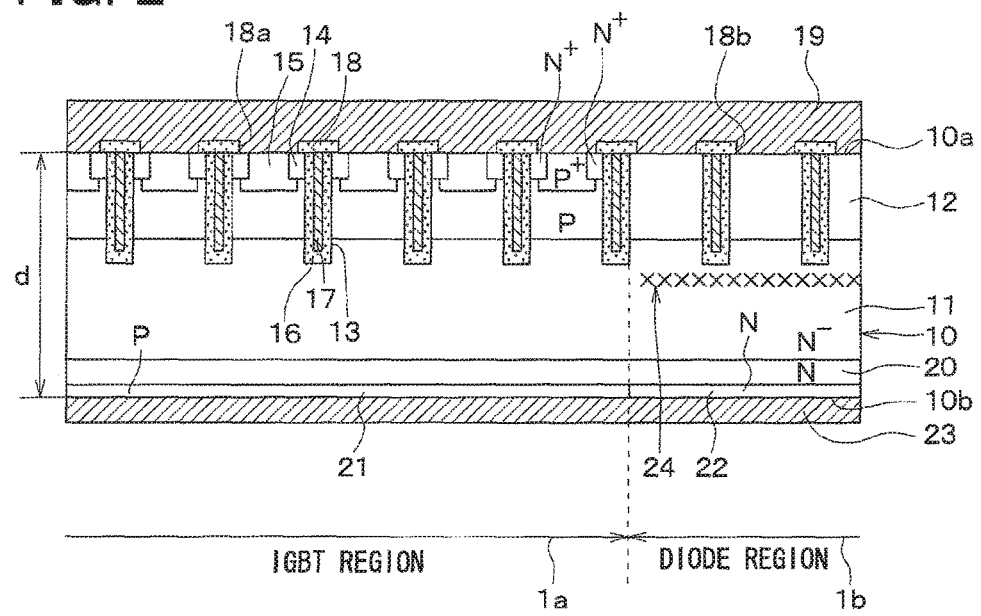
FIG. 2 is a cross-sectional view taking along a line II-II of FIG. 1.

As shown in FIG. 1 and FIG. 2, the cell region 1 includes IGBT regions 1a and diode regions 1b. An IGBT element is arranged in the IGBT region 1a and a diode element is arranged in the diode region 1b.

Specifically, the IGBT region 1a and the diode region 1b are arranged in an N⁻ type semiconductor substrate 10. The N⁻ type semiconductor substrate 10 provides a drift layer 11. Each of the IGBT regions 1a and the diode regions 1b extends along an extension direction of a first surface 10a of the semiconductor substrate 10. The extension direction corresponds to a vertical direction of the paper surface of FIG. 1. The extension direction will be also referred to as a longitudinal direction of the IGBT region 1a and the diode region 1b.

The IGBT regions is and the diode regions 1b are arranged alternately in a direction perpendicular to the extension direction. The direction, in which the IGBT regions is and the diode regions 1b are arranged, will be also referred to as an arrangement direction of the IGBT regions 1a and the diode regions 1b.

A P type base layer 12 is arranged on the drift layer 11. Namely, the P type base layer 12 is arranged adjacent to the first surface 10a of the semiconductor substrate 10. The P type base layer 12 has an impurity concentration of around $1.0 \times 10^{17}$ cm³. Plural trenches 13 are arranged to pass through the base layer 12 and reach the drift layer 11. The trenches 13 separate the base layer 12 into plural portions.

In the present embodiment, the trenches 13 extend along a planar direction along the first surface 10a of the semiconductor substrate 10. The planar direction corresponds to a front-back direction of the paper surface of FIG. 2. The trenches 13 are arranged to have equal intervals with each other. The first surface 10a of the semiconductor substrate 10 is a surface of the base layer 12 opposite to the drift layer 11.

The base layer 12 functions as a channel region in the IGBT region 1a. In the base layer 12 as the channel region (i.e., the base layer 12 in the IGBT region 1a), N⁺ type emitter regions 14 and P⁺ type body regions 15 are arranged. Each of the body regions 15 is sandwiched between the emitter regions 14.

The emitter region 14 has impurity concentration higher than the drift layer 11. The emitter region 14 ends within the base layer 12, and is in contact with a side surface of the trench 13. The body region 15 has impurity concentration higher than the base layer 12. Similarly to the emitter region 14, the body region 15 ends within the base layer 12.

For details, the emitter region 14 is arranged between the trenches 13. The emitter region 14 has a bar shape extending along a longitudinal direction of the trench 13 and is in contact with the side surface of the trench 13. The emitter region 14 ends shallower than an end of the trench 13. Namely, the emitter region 14 is shorter than the trench 13 in the longitudinal direction of the trench 13. The body region 15 has a bar shape extending along the longitudinal direction of the trench 13 (i.e., extending along the emitter region 14) and is sandwiched between two emitter regions 14. In the present embodiment, the body region 15 is deeper than the emitter region 14 with respect to the first surface 10a of the semiconductor substrate 10.

In each of the trenches 13, a gate insulation film 16 and a gate electrode 17 are implanted. The gate insulation film 16 covers an inner wall surface of the trench 13. The gate electrode 17 is made of polysilicon and the like, and is arranged on the gate insulation film 16. As described above, a trench gate structure is provided.

On the base layer 12 (i.e., on the first surface 10a of the semiconductor substrate 10), an interlayer insulation film 18 is arranged. The interlayer insulation film 18 is made of, for example, boron phosphorous silicon glass (BPSG). The interlayer insulation film 18 has contact holes 18a and contact holes 18b. The contact hole 18a exposes a part of the emitter region 14 and the body region 15 in the IGBT region 1a. The contact hole 18b exposes the base layer 12 in the diode region 1b.

On the interlayer insulation film 18, an upper electrode 19 is arranged. The upper electrode 19 is electrically connected to the emitter region 14 and the body region 15 through the contact holes 18a in the IGBT region 1a. The upper electrode 19 is electrically connected to the base layer 12 through the contact holes 18b in the diode region 1b. That is, the upper electrode 19 functions as an emitter electrode in the IGBT region, and functions as an anode electrode in the diode region 1b.

An N type field stop layer 20, which is referred to as a FS layer, is arranged opposite to the base layer 12 with respect to the drift layer 11. Namely, the FS layer 20 is arranged adjacent to a second surface 10b of the semiconductor substrate 10. The FS layer is not always required. The FS layer is arranged to improve performance such as resistance and steady loss by restricting a depletion layer from spreading, and to control the amount of holes inserted from the second surface 10b of the semiconductor substrate 10.

In the IGBT region 1a, a P type collector layer 21 is arranged opposite to the drift layer 11 with respect to the FS layer 20. In the diode region 1b, an N type cathode layer 22 is arranged opposite to the drift layer 11 with respect to the FS layer 20. That is, the IGBT region 1a and the diode region 1b are divided according to whether a layer arranged adjacent to the second surface 10b of the semiconductor substrate 10 is the collector layer 21 or the cathode layer 22. In other words, a boundary between the IGBT region 1a and the diode region 1b is defined by a boundary between the collector layer 21 and the cathode layer 22.

In the present embodiment, the second surface 10b of the semiconductor substrate 10 is provided by the collector layer 21 and the cathode layer 22. In the present embodiment, the collector layer 21 is arranged opposite to the base layer 12, which has the emitter region 14 and the body region 15, with respect to the FS layer 20. The cathode layer 22 is arranged opposite to the base layer 12, which does not have the emitter region 14 and the body region 15, with respect to the FS layer 20. That is, in the present embodiment, the boundary between the IGBT region 1a and the diode region 1b is defined by a boundary between the base layer 12, which has the emitter region 14 and the body region 15, and the base layer 12, which does not have the emitter region 14 and the body region 15.

As described above, the base layer 12 is arranged adjacent to the first surface 10a of the semiconductor substrate 10, and the collector layer 21 and the cathode layer 22 are arranged adjacent to the second surface 10b of the semiconductor substrate 10. That is, the semiconductor substrate 10 includes the collector layer 21, the cathode layer 22, the FS layer 20, the drift layer 11 and the base layer 12 laminated in orders.

A lower electrode 23 is arranged on the collector layer 21 and the cathode layer 22 (i.e., on the second surface 10b of the semiconductor substrate 10). The lower electrode 23 functions as the collector electrode in the IGBT region 1a, and functions as the cathode electrode in the diode region 1b.

As a result, a PN junction diode, including the base layer 12 as an anode and including the drift layer 11, the FS layer 20 and the cathode layer 22 as a cathode, is provided in the diode region 1b.

A damage region 24 is arranged adjacent to the first surface 10a of the semiconductor substrate 10. In other words, the damage region 24 is arranged at a surface layer portion of the semiconductor substrate 10. The damage region 24 is arranged in a surface layer portion of the drift layer 11. Specifically, the damage region 24 is arranged in the diode region 1b. The damage region 24 protrudes from the diode region 1b toward the outer peripheral region 2 in the longitudinal direction of the diode region 1b.

That is, the damage region 24 is arranged in the diode region 1b and a part of the outer peripheral region 2 adjacent to the boundary between the diode region 1b and the outer peripheral region 2.

As a result, a hole (i.e., an excess hole) of the drift layer 11 in the outer peripheral region 2 is recombined with an electron and eliminated at the damage region 24, arranged in the outer peripheral region 2. Therefore, the hole is restricted from being inserted from the outer peripheral region 2 into the diode region 1b.

A relationship between the damage region 24, arranged in the outer peripheral region 2, and a thickness of the semiconductor substrate 10 will be described. Hereinafter, a thickness of the semiconductor substrate 10 is represented as "d", a width of the damage region 24 arranged in the outer peripheral region 2 is represented as "W1". A ratio of the width of the damage region 24, arranged in the outer peripheral region 2, to the thickness of the semiconductor substrate 10 is defined as a first thickness ratio (W1/d).

The width W1 of the damage region 21 arranged in the outer peripheral region 2 is a length in the longitudinal direction of the diode region 1b, which is one of the directions along the plane of the first surface 10a of the semiconductor substrate 10. For example, the width W1 is the length along the vertical direction of the paper surface of FIG. 1. In other words, the width W1 is the length in a direction perpendicular to the arrangement direction of the IGBT regions 1s and the diode regions 1b.

Figure 4:
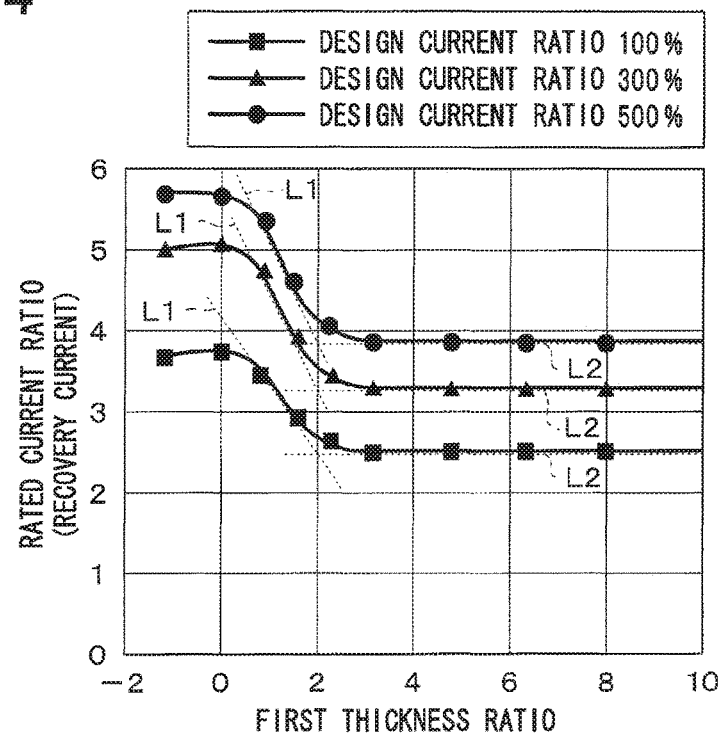
FIG. 4 is a diagram illustrating a simulation result of a relationship between a first thickness ratio and a rated current ratio.

As shown in FIG. 4, rated current value steeply decreases when the first thickness ratio (W1/d) exceeds 0, and almost does not change when the first thickness ratio (W1/d) exceeds 2. In other words, at a point where the first thickness ratio (W1/d) is equal to 2, a tangent line L1 and a tangent line L2 crosses. The tangent line L1 corresponds to a portion in which the rated current value steeply decreases. The tangent line L2 corresponds to a portion in which the rated current value almost does not change. Accordingly, the damage region 24 is arranged so that the first thickness ratio (W1/d) is equal to or more than 2.

In FIG. 4, when the damage region 24 is arranged only in the diode region 1b, the first thickness ratio (W1/d) is equal to 0. When the damage region 24 is not arranged in the portion of the diode region 1b adjacent to the outer peripheral region 2, the first thickness ratio (W1/d) is less than 0.

The structure of the cell region 1 of the present embodiment is described hereinabove. Next, the structure of the outer peripheral region 2 surrounding the cell region 1 will be described.

Figure 3:
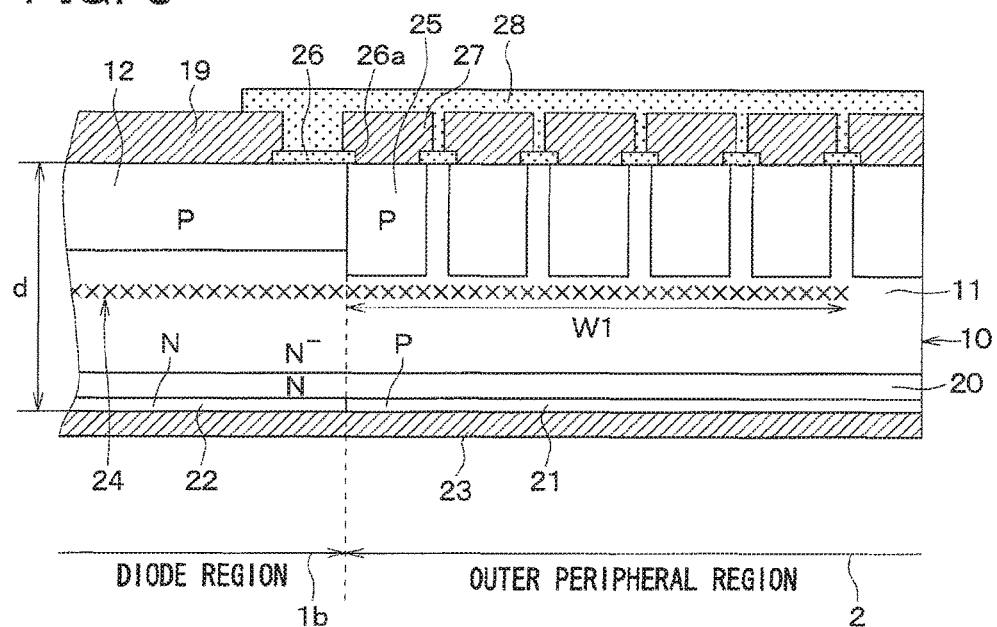
FIG. 3 is a cross-sectional view taking along a line of FIG. 1.

As shown in FIG. 3, in the outer peripheral region 2, plural P type guard rings 25 are arranged adjacent to the first surface 10*a* of the semiconductor substrate 10. The guard rings 25 have a multiple ring structure. Each of the guard rings 25 has impurity concentration higher than the base layer 12. For example, the guard ring 25 has impurity concentration around $1.0 \times 10^{18}$ cm$^{-3}$. In the present embodiment, one of the guard rings 25 that is arranged closest to the cell region 1 is arranged to be in contact with the base layer 12 of the diode region 1*b*.

An oxide film 26 is arranged on the guard rings 25. The oxide film 26 has openings 26*a* at portions corresponding to the guard rings 25. Outer peripheral electrodes 27 are arranged on the oxide film 26. The outer peripheral electrodes 27 are electrically connected to the guard rings 25 through the openings 26*a* of the oxide film 26. A passivation film 28 is arranged to cover the outer peripheral electrodes 27, and the outer peripheral electrodes 27 are protected by the passivation film 28.

The P type collector layer 21 is arranged opposite to the drift layer 11 with respect to the FS layer 20 in the second surface 10*b* side of the semiconductor substrate 10. That is, the diode region 1*b* and the outer peripheral region 2 are divided according to whether a layer arranged adjacent to the second surface 10*b* of the semiconductor substrate 10 is the collector layer 21 or the cathode layer 22. In other words, the boundary between the diode region 1*b* and the outer peripheral region 2 is defined by the boundary between the collector layer 21 and the cathode layer 22.

In the present embodiment, the collector layer 21 is arranged opposite to the guard rings 25 with respect to the FS layer 20. The cathode layer 22 is arranged opposite to the base layer 12 with respect to the FS layer 20. That is, in the present embodiment, the boundary between the diode region 1*b* and the outer peripheral region 2 is defined by the boundary between the guard rings 25 and the base layer 12.

As described above, the semiconductor device of the present embodiment is provided. In the present embodiment, N type, N$^-$ type and N$^+$ type correspond to a first conductivity type, and P type and P$^+$ type correspond to a second conductivity type.

Figure 5:
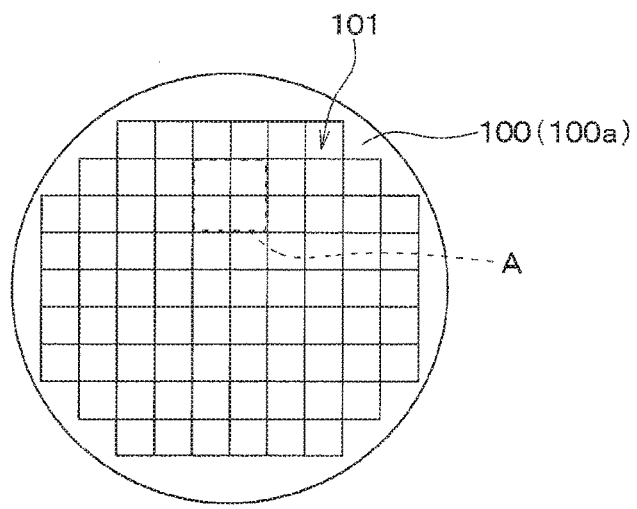
FIG. 5 is a schematic plan view of a wafer for producing the semiconductor device shown in FIG. 1.

Next, a method for producing the above semiconductor device will be described. As shown in FIG. 5, an N$^-$ type wafer 100 having plural chip formation regions 101 is prepared.

The base layer 12, which is shown in FIG. 1, is formed in a surface 100*a* of the wafer 100 by thermal diffusion. Thereafter, the trench gate structure, the emitter regions 14 and the body regions 15 are formed in each of the chip formation regions 101. The interlayer insulation film 18 is formed on the base layer 12, and the contact holes 18*a* and 18*b* are formed in the interlayer insulation film 18. The upper electrode 19 is formed on the interlayer insulation film 18. The upper electrode 19 is electrically connected to the emitter regions 14 and the body regions 15 through the contact holes 18*a*, and electrically connected to the base layer 12 through the contact holes 18*b*.

The FS layer 20 is formed in another surface 100*b* of the wafer 100. The collector layer 21 and the cathode layer 22 are formed opposite to the drift layer 11 with respect to the FS layer 20.

Figure 6:
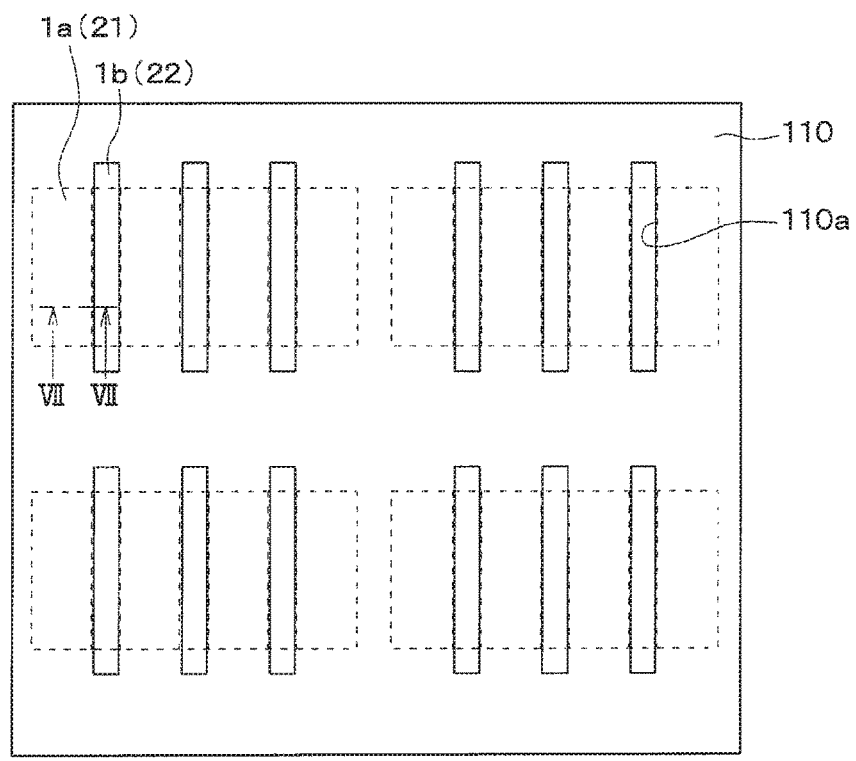
FIG. 6 is a schematic plan view illustrating a situation in which a mask is arranged on a second surface of the wafer.
Figure 7:
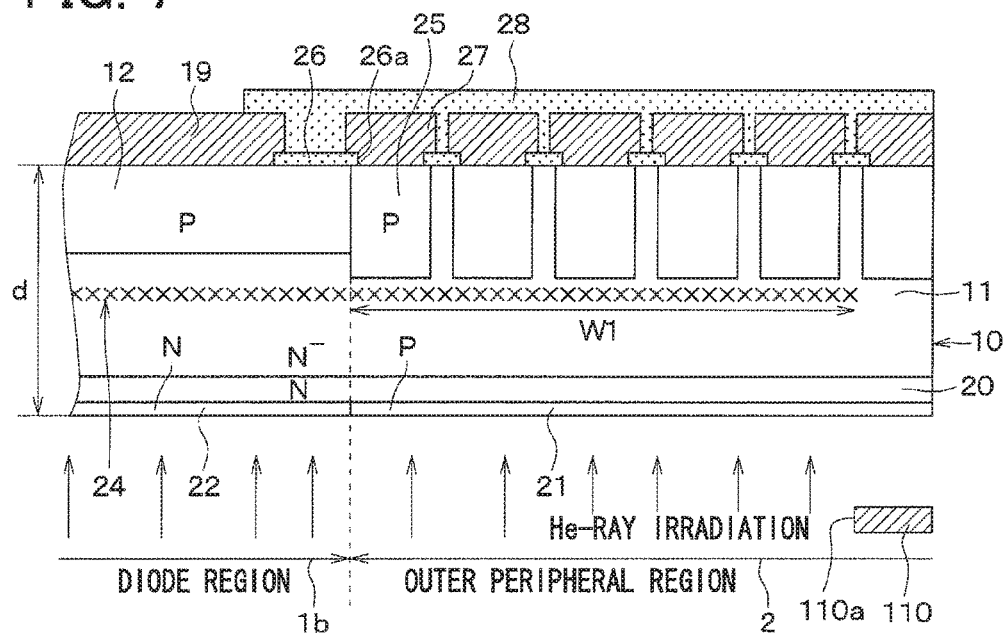
FIG. 7 is a cross-sectional view illustrating a situation in which the mask is arranged on the second surface of the wafer and He-ray is irradiated.

Next, as shown in FIG. 6 and FIG. 7, a mask 110 is prepared and disposed on the surface 100*b* of the wafer 100.

The mask 110 has openings 110*a* at potions opposing to the diode regions 1*b* (i.e., cathode layer 22) and the portions of the outer peripheral region 2 adjacent to the boundary between the outer peripheral region 2 and the diode region 1*b* (i.e., a part of the collector layer 21). The damage region 24 is formed by irradiating He-ray from the surface 100*b* of the wafer 100. FIG. 6 is an enlarged diagram illustrating the situation in which the mask 110 is disposed at a region A of FIG. 5.

The lower electrode 23 is formed on the surface 100*b* of the wafer 100. Thereafter, the wafer 100 is divided into chip units to produce the above semiconductor device. The outer peripheral region 2, including the guard rings 25 and the outer peripheral electrodes 27, is formed in the above method, or is formed in another exclusive process.

As described above, in the present embodiment, the damage region 24, having the first thickness ratio (W1/d) equal to or higher than 2, is arranged in the portion of the outer peripheral region 2 adjacent to the boundary between the outer peripheral region 2 and the diode region 1*b*. The hole 1*a* restricted from being inserted from the outer peripheral region 2 to the diode region 1*b*. As a result, the recovery characteristic is improved in the portion of the diode region 1*b* adjacent to the boundary between the outer peripheral region 2 and the diode region 1*b*.

(Second Embodiment)

A second embodiment of the present disclosure will be described. In the second embodiment, a layout of the damage region 24 is different from the first embodiment. Since the other part of the second embodiment is similar to the first embodiment, only the part different from the first embodiment will be described.

Figure 8:
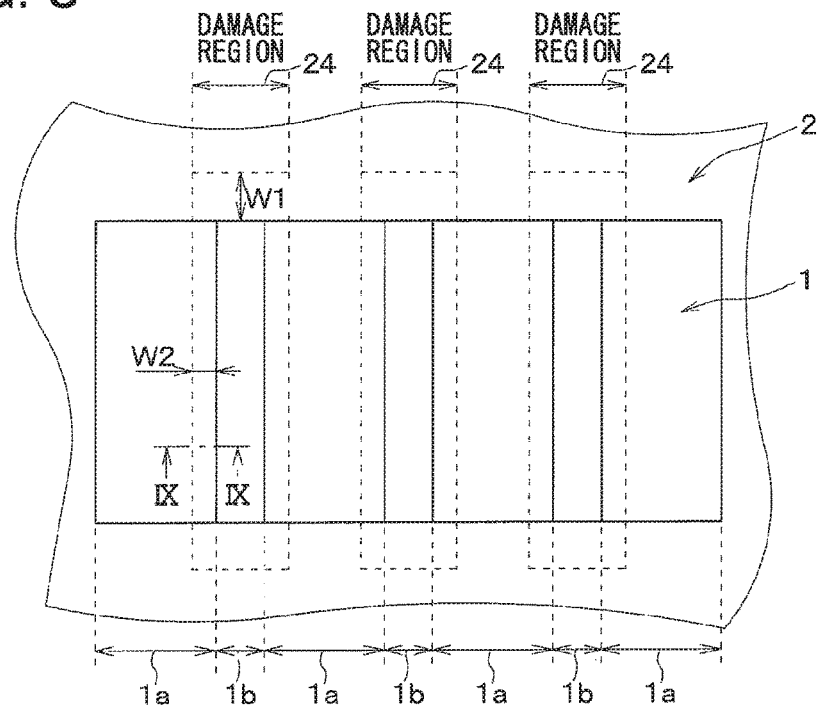
FIG. 8 is a schematic plan view of a semiconductor device according to a second embodiment of the present disclosure.
Figure 9:
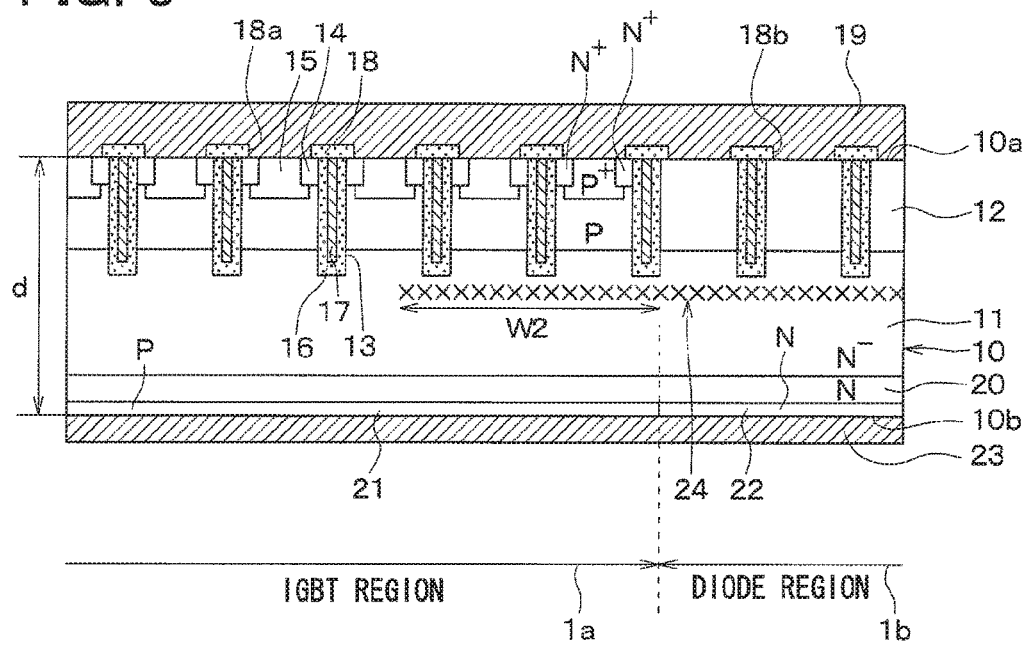
FIG. 9 is a cross-sectional view taking along a line IX-IX of FIG. 8.

As shown in FIG. 8 and FIG. 9, in the present embodiment, the damage region 24 protrudes from the diode region 1*b* toward the IGBT region 1*a*. As a result, a hole (i.e., an excess hole) of the drift layer 11 in the IGBT region 1*a* is recombined with an electron and eliminated at the damage region 24, arranged in the IGBT region 1*a*. Therefore, the hole is restricted from being inserted from the IGBT region 1*a* into the diode region 1*b*.

A relationship between the damage region 24, arranged in the IGBT region 1*a*, and the thickness of the semiconductor substrate 10 will be described. Hereinafter, the thickness of the semiconductor substrate 10 is represented as "d", a width of the damage region 24 arranged in the IGBT region 1*a* is represented as "W2". A ratio of the width of the damage region 24, arranged in the IGBT region 1*a*, to the thickness of the semiconductor substrate 10 is defined as a second thickness ratio (W2/d).

The width W2 of the damage region 24, arranged in the IGBT region 1*a*, is a length in the arrangement direction of the IGBT regions 1*a* and the diode regions 1*b*, which is one of the directions along the plane of the first surface 10*a* of the semiconductor substrate 10. For example, the width W2 is the length along the horizontal direction of the paper surface of FIG. 9.

Figure 10:
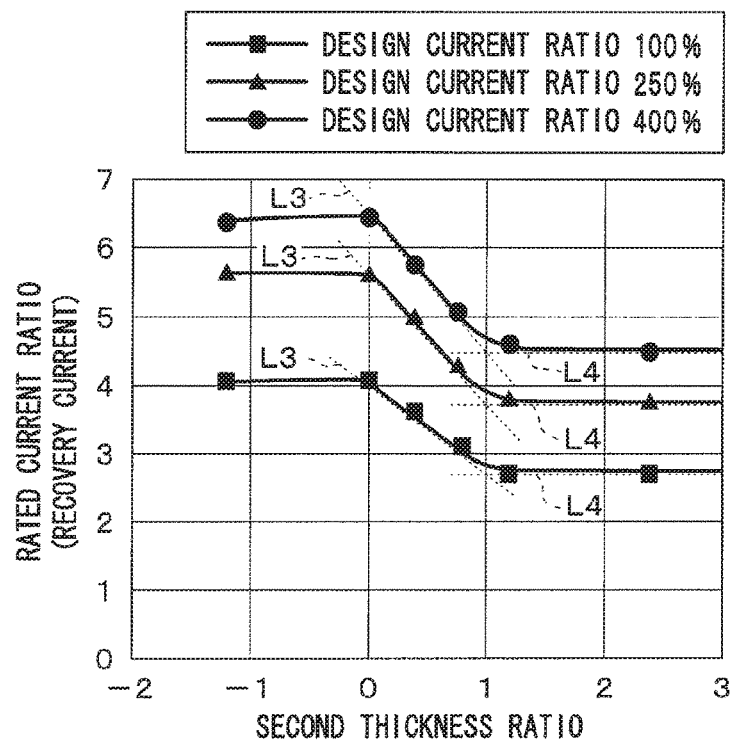
FIG. 10 is a diagram illustrating a simulation result of a relationship between a second thickness ratio and a rated current ratio.

As shown in FIG. 10, rated current value steeply decreases when the second thickness ratio (W2/d) exceeds 0, and almost does not change when the second thickness ratio (W2/d) exceeds 1. In other words, at a point where the second thickness ratio (W2/d) is equal to 1, a tangent line L3 and a tangent line L4 cross. The tangent line L3 corresponds to a portion in which the rated current value steeply changes. The tangent line L4 corresponds to a portion in which the rated current value almost does not change. Accordingly, the damage region 24 is arranged so that the second thickness ratio (W2/d) is equal to or more than 1.

The rated current ratio of the present embodiment, which is described in FIG. 10, corresponds to a recovery current for a current flowing when the IGBT element (i.e., the semiconductor device) is turned on. When the rated current ratio decreases, the recovery current also decreases. A design current ratio of the present embodiment, which is described in FIG. 10, corresponds to a ratio of a test current (i.e., an on-current applied to the IGBT element) to an allowable current (i.e., design current) of the IGBT element. In FIG. 10, when the damage region 24 is arranged only in the diode region 1b, the second thickness ratio (W2/d) is equal to 0. When the damage region 24 is not arranged in the portion of the diode region 1b adjacent to the IGBT region 1a, the second thickness ratio (W2/d) is less than 0.

Figure 11:
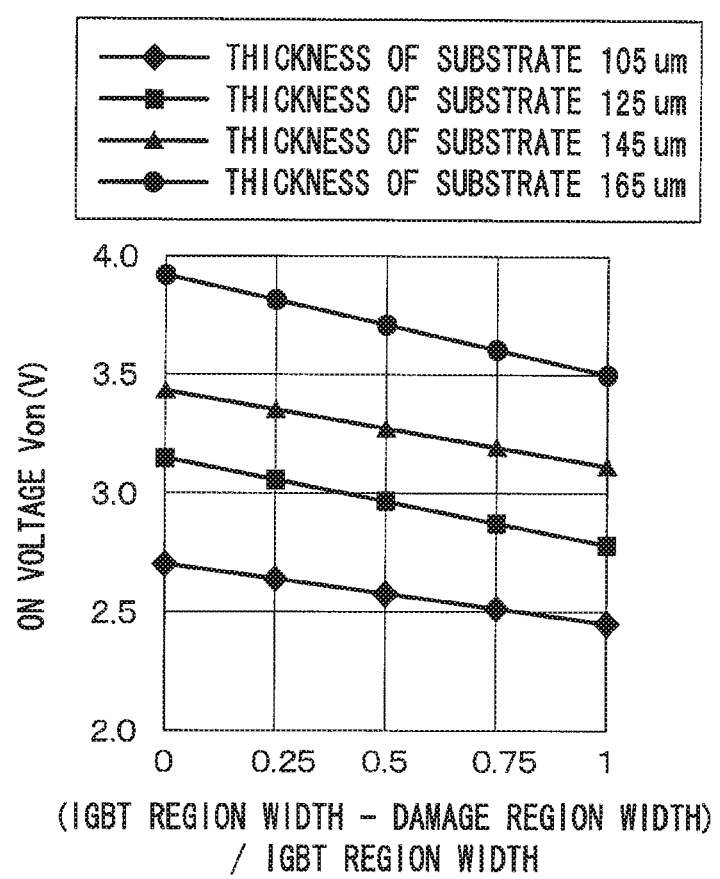
FIG. 11 is a diagram illustrating a relationship between a ratio of damage region width to IGBT region width and on voltage.

When the damage region 24 is arranged in the IGBT region 1a, a hole is recombined with an electron and eliminated at the damage region 24 even in the regular operation of the IGBT element, and the on-voltage increases. As shown in FIG. 11, on-voltage increases as a ratio of the width of the damage region 24 to the width of the IGBT region 1a increases. That is, on-voltage decreases as a ratio of a width a part of the IGBT region 1a, in which the damage region 24 is not arranged, to the width of the IGBT region 1a increases. In other words, on-voltage decreases as a ratio of width difference between the IGBT region 1a and the damage region 24 to the width of the IGBT region 1a increases.

Accordingly, the damage region 24 is arranged at the portion of the IGBT region 1a adjacent to the boundary between the IGBT region 1a and the diode region 1b, so that the second thickness ratio is equal to or more than 1. The damage region 24 is not arranged out of the portion of the IGBT region 1a adjacent to the boundary between the IGBT region 1a and the diode region 1b.

For example, the IGBT region 1a preferably has a portion, in which the damage region 24 is not arranged, (i.e., a no-damage-region-arranged portion) having a width equal to or more than half of the width of the IGBT region 1a. In other words, a width of a portion of the IGBT region 1a, in which the damage region 24 is not arranged, is preferably equal to or more than half of the width of entire IGBT region 1a.

The width of the IGBT region 1a is a length in the arrangement direction of the IGBT regions 1a and the diode regions 1b, which is one of the directions along the plane of the first surface 10a of the semiconductor substrate 10. For example, the width of the IGBT region 1a is the length along the horizontal direction of the paper surface of FIG. 8.

Figure 12:
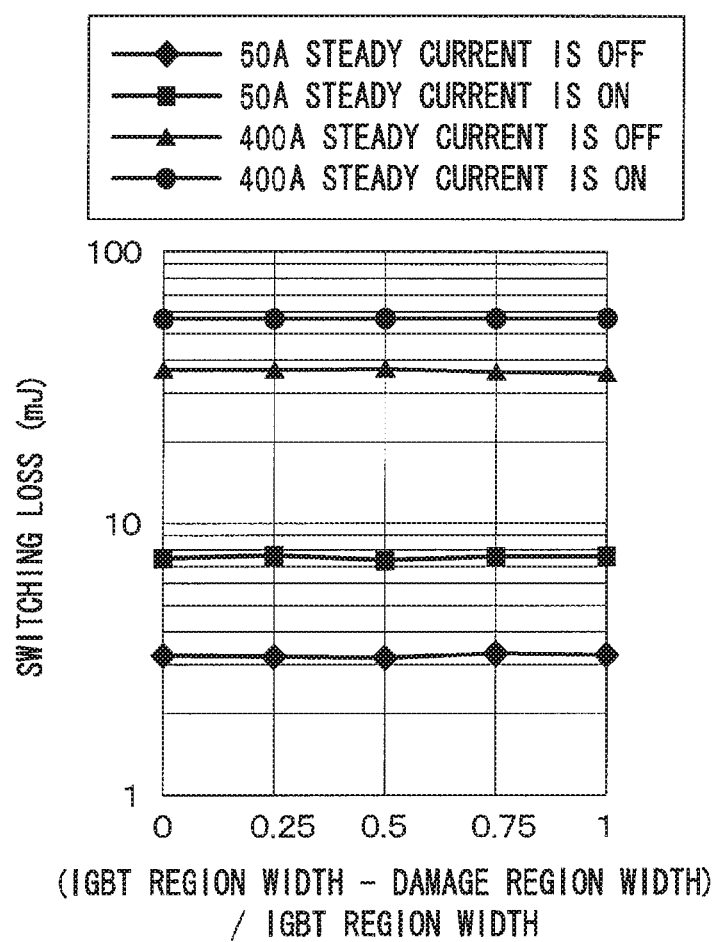
FIG. 12 is a diagram illustrating a relationship between the ratio of the damage region width to the IGBT region width and switching loss.

Even when the damage region 24 is arranged in the IGBT region 1a as described above, the switching loss does not change as shown in FIG. 12. The steady current described in FIG. 12 is a current flowing when the IGBT element (i.e., the semiconductor device) is turned on.

As described above, in the second embodiment, the damage region 24 is arranged at the portion on the IGBT region 1a adjacent to the boundary between the IGBT region 1a and the diode region 1b, so that the second thickness ratio is equal to or more than 1. The IGBT region 1a includes the portion in which the damage region 24 is not arranged.

The on-voltage is restricted from decreasing, and the holes are restricted from being inserted from the IGBT region 1a to the diode region 1b. In addition to restricting the on-voltage from decreasing, the recovery characteristic is improved in the portion of the diode region 1b adjacent to the boundary between the IGBT region 1a and the diode region 1b. That is, in addition to restricting the on-voltage from decreasing, the recovery current and the recovery loss is reduced and the recovery resistance is improved.

Figure 13:
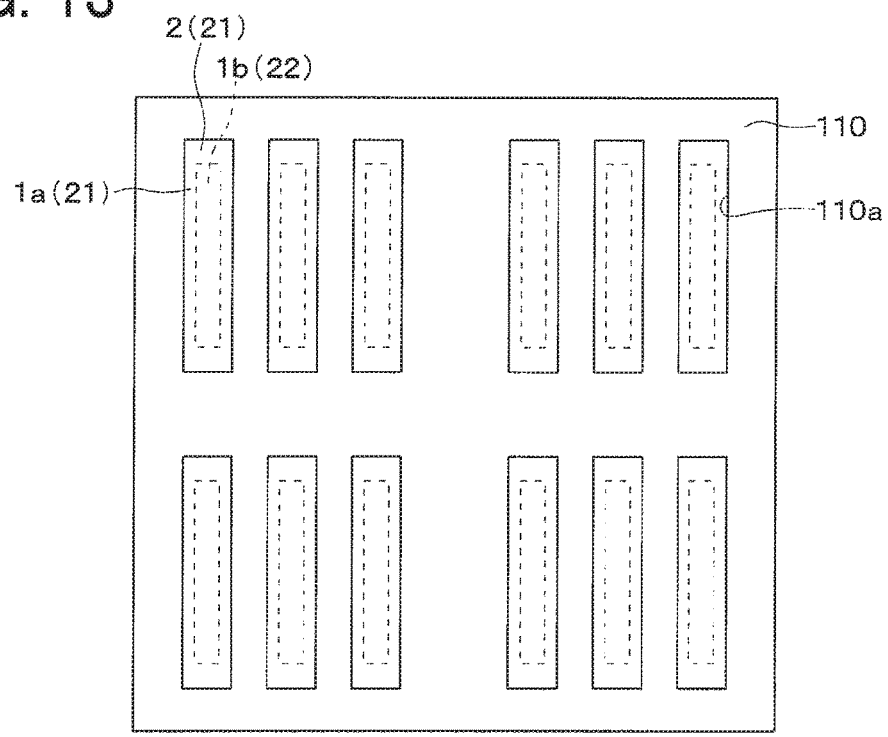
FIG. 13 is a schematic plan view illustrating a situation in which a mask is arranged on a second surface of the wafer.

A method for producing the above semiconductor device is similar to the first embodiment. A mask 110 shown in FIG. 13 is prepared when the He-ray is irradiated as shown in FIG. 7. Specifically, the mask 110 has openings 110a at portions opposing to the portions of the outer peripheral region 2 adjacent to the boundary between the outer peripheral region 2 and the diode region 1b (i.e., a part of the collector layer 21). As such, the semiconductor device according to the second embodiment is produced. FIG. 13 is an enlarged diagram illustrating the situation in which the mask 110 is disposed at a region A of FIG. 5.

(Third Embodiment)

A third embodiment of the present disclosure will be described. In the third embodiment, a layout of the damage region 24 is different from the second embodiment. Since the other part of the third embodiment is similar to the second embodiment, only the part different from the second embodiment will be described.

Figure 14:
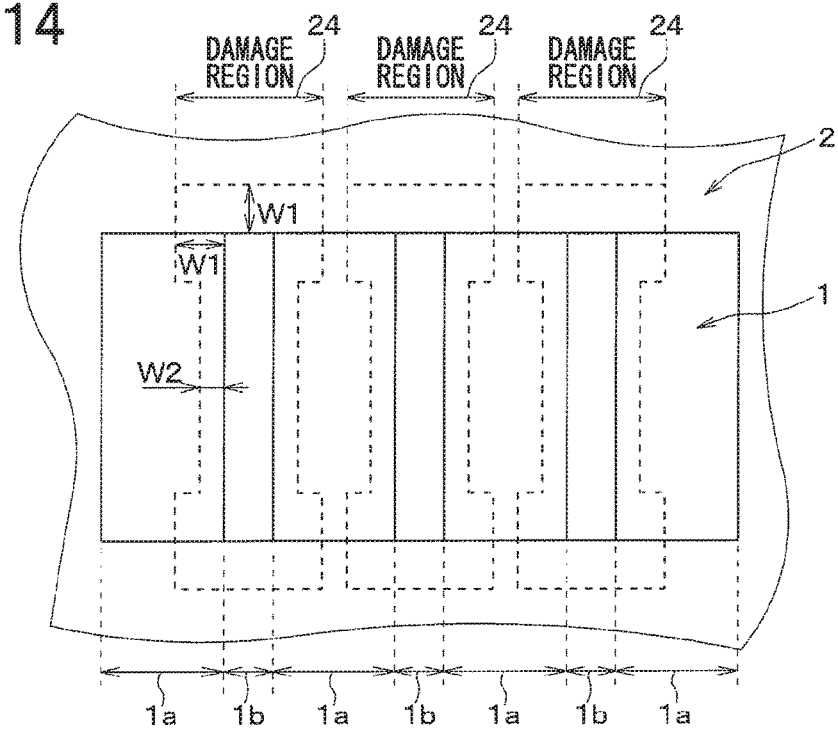
FIG. 14 is a schematic plan view of a semiconductor device according to a third embodiment of the present disclosure.

As shown in FIG. 14, the damage region 24 is arranged in the portion of the IGBT region 1a adjacent to the boundary between the diode region 1b and the IGBT region 1a. The damage region 24 in the IGBT region 1a includes an end portion adjacent to an end of the diode region 1b in the longitudinal direction of the diode region 1b. The damage region 24 in the IGBT region 1a includes a center portion adjacent to a center of the diode region 1b in the longitudinal direction of the diode region 1b. A width of the end portion of the damage region 24 is greater than a width of the center portion of the damage region 24. Specifically, the width of the end portion of the damage region 24 in the IGBT region 1a is W1, and the width of the center portion of the damage region 24 in the IGBT region 1a is W2. The width W1 is a length along the horizontal direction of the paper surface of FIG. 14. The width W2 is a length along the horizontal direction of the paper surface of FIG. 14.

As a result, a hole is restricted from being inserted from the outer peripheral region 2 to the diode region 1b through the IGBT region 1a, and the recovery characteristic of the diode region 1b is further improved.

A method for producing the above semiconductor device is similar to the first embodiment. A mask 110 is prepared when the He-ray is irradiated as shown in FIG. 7, and the mask 110 having the openings 110a size of which are larger in each end of the diode region 1b than the center of the diode region 1b.

(Other Embodiments)

In the first embodiment, the first conductivity type corresponds to P type and the second conductivity type corresponds to N type. However, the first conductivity type may correspond to N type and the second conductivity type may correspond to P type.

In the above embodiments, the portion of the base layer 12 arranged in the IGBT region 1a (i.e., the channel region) may have different impurity concentration from the portion of the base layer 12 arranged in the diode region 1b (i.e., the anode).

In the above embodiments, another damage layer different from the damage region 24 may be arranged adjacent to the second surface 10b of the semiconductor substrate 10. The damage layer arranged in the IGBT region 1a recombines and quenches the excess carriers of the drift layer 11 in the IGBT region 1a. Therefore, excellent trade-off characteristic between the switching loss and the steady loss is achieved in the IGBT element. The damage layer arranged in the diode region 1b recombines and quenches the excess carriers of the drift layer 11 in the diode region 1b. Therefore, excellent trade-off characteristic between the switching loss and the steady loss is achieved in the diode element.

In the above embodiments, IGBT element may be a planar type instead of the trench gate type.

Figure 15A:
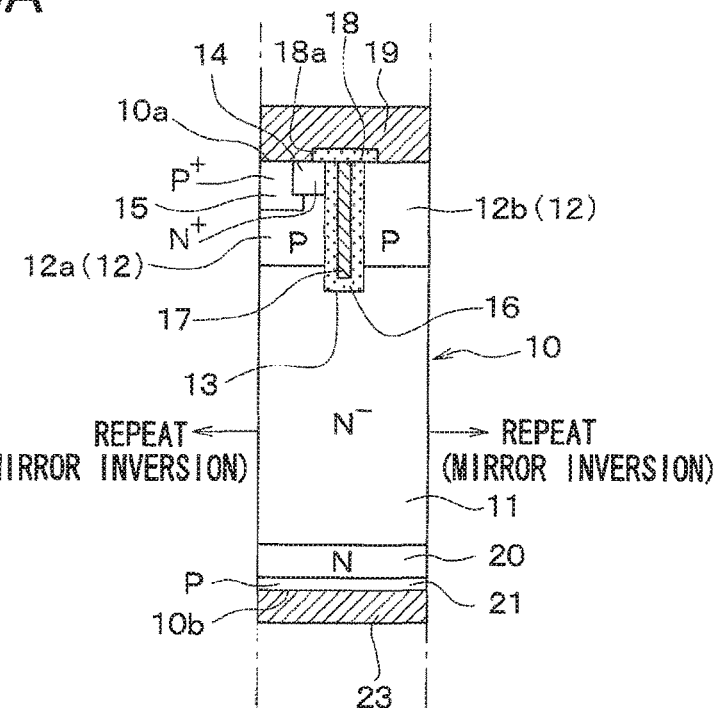
FIG. 15A is a diagram illustrating a minimum unit of an IGBT element according to other embodiment of the present disclosure.

In the above embodiments, as shown in FIG. 15A, the IGBT region 1a may have repetition units, in which the emitter region 14 and the body region 15 are omitted, repeatedly mirror-inverted. In such a case, among the base layer 12, which is divided by the trenches 13, the portion having the emitter region 14 functions as the channel region 12a, and the portion not having the emitter region 14 functions as the float region 12b.

Figure 15B:
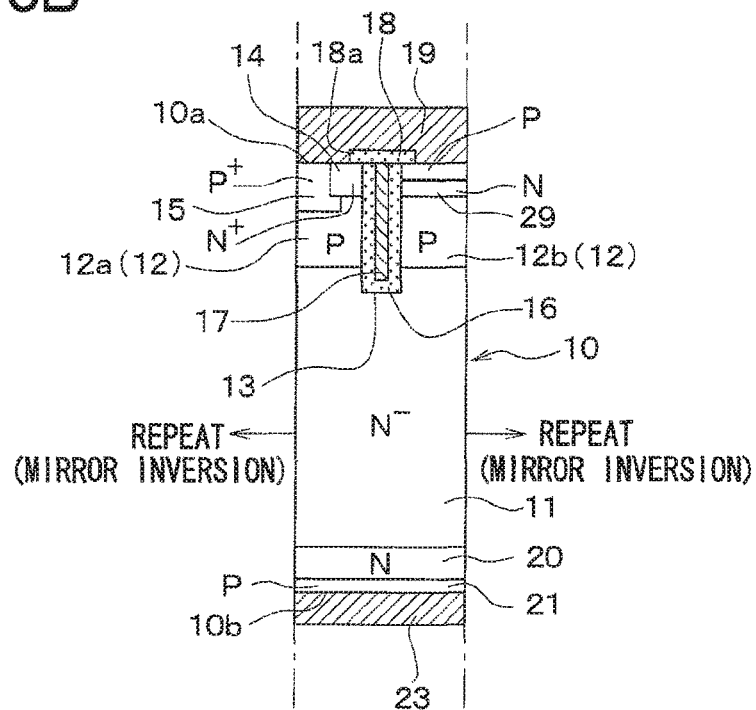
FIG. 15B is a diagram illustrating a minimum unit of the IGBT element according to the other embodiment of the present disclosure.

As shown in FIG. 15B, the IGBT region 1a may have repetition units, in which an N type hole stopper layer (HS layer) 29 is arranged to divide the float region 12b in the depth direction, repeatedly mirror-inverted. In such a case, the HS layer 29 restricts the holes in the drift layer 11 from flowing into the upper electrode 19 through the float region 12b.

Figure 15C:
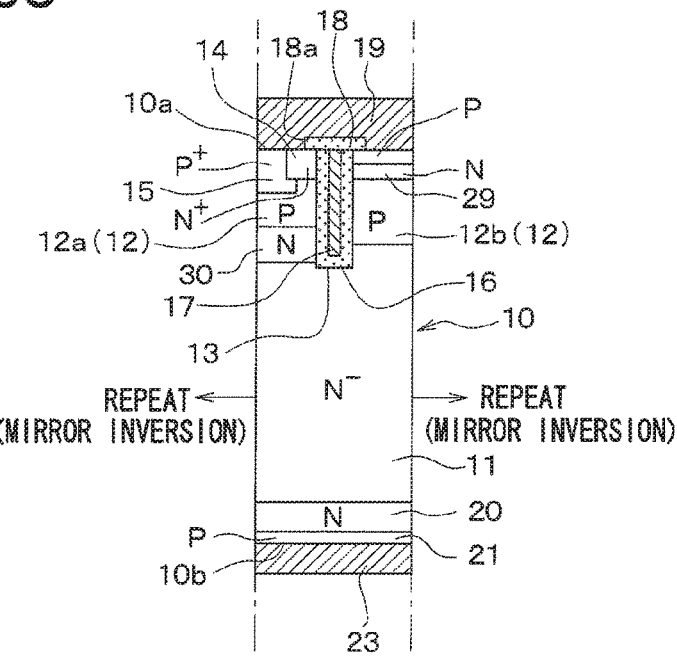
FIG. 15C is a diagram illustrating a minimum unit of the IGBT element according to the other embodiment of the present disclosure.

As shown in FIG. 15C, the IGBT region 1a may have repetition units, in which the HS layer 29 is arranged and a carrier storage layer (CS layer) 30 is arranged between the channel region 12a and the drift layer 11, repeatedly mirror-inverted. In such a case, the CS layer 30 restricts the holes in the drift layer 11 from flowing into the upper electrode 19 through the channel region 12a.

Although not especially illustrated, in FIG. 15C, the HS layer 29 may be omitted in the IGBT region 1a.

In the second and the third embodiments, the boundary between the IGBT region 1a and the diode region 1b corresponds to the boundary between the base layer 12, which has the emitter region 14 and the body region 15, and the base layer 12, which does not have the emitter region 14 and the body region 15.

Figure 16:
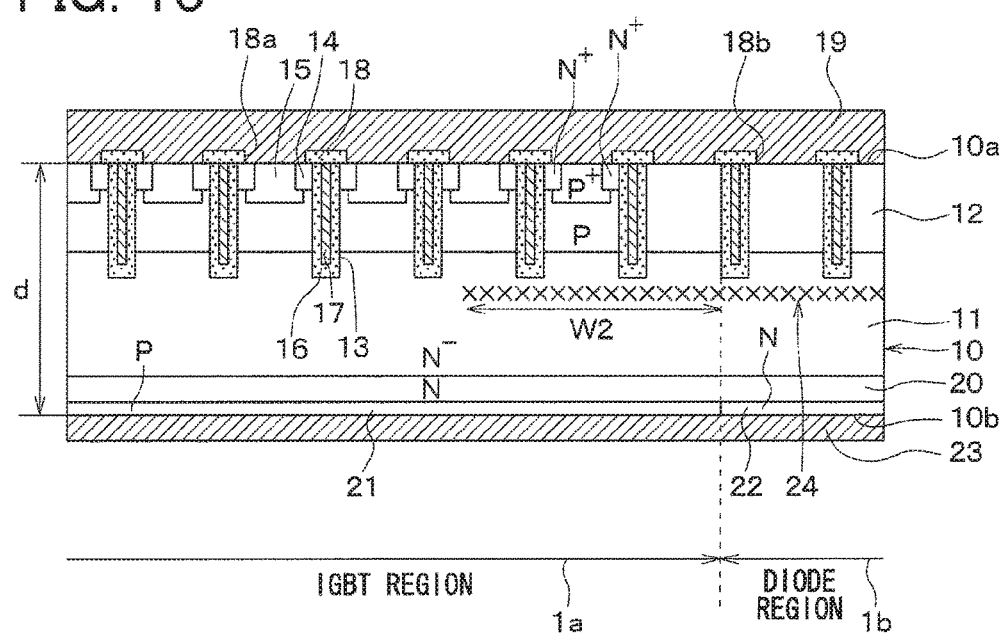
FIG. 16 is a cross-sectional view of a semiconductor device according to the other embodiment of the present disclosure.

However, the IGBT region 1a and the diode region 1b are divided according to whether the layer arranged adjacent to the second surface 10b of the semiconductor substrate 10 is the collector layer 21 or the cathode layer 22. Therefore, as shown in FIG. 16, the boundary between the IGBT region 1a and the diode region 1b may be located between the adjacent base layers 12 both of which do not have the emitter region 14 and the body region 15.

That is, the base layer 12, which does not have the emitter region 14 and the body region 15, may be arranged in the IGBT region 1a adjacent to the diode region 1b. In such a semiconductor device, when the damage region 24, having the second thickness ratio (W2/d) equal to or more than 1, is arranged in the IGBT region 1a, the recovery characteristic of the diode region 1b is improved.

Figure 17:
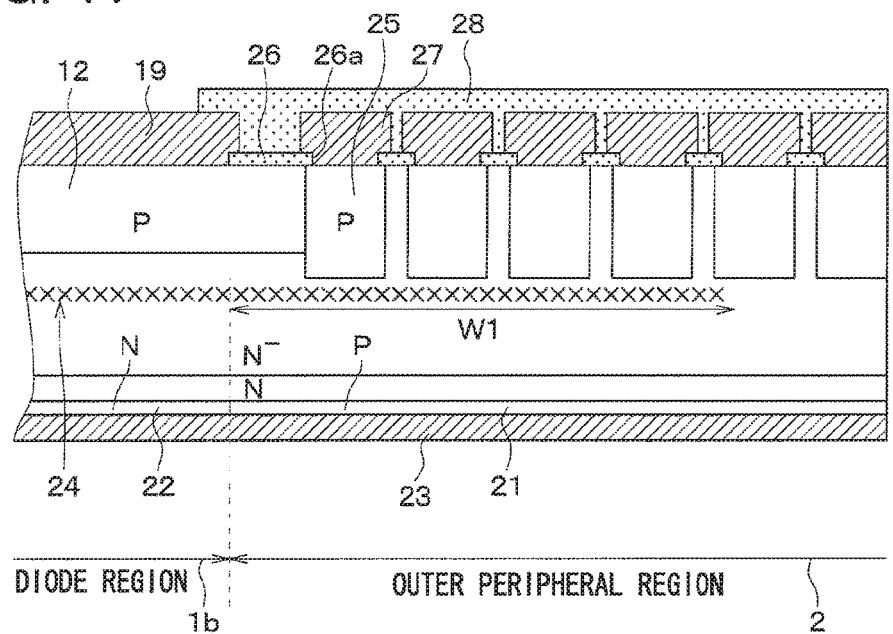
FIG. 17 is a cross-sectional view of a semiconductor device according to the other embodiment of the present disclosure.

In the first to third embodiments, as shown in FIG. 17, the diode region 1b and the outer peripheral region 2 may be arranged to divide the base layer 12. That is, the base layer 12 may be arranged in the outer peripheral region 2 adjacent to the diode region 1b. In such a semiconductor device, when the damage region 24, having the first thickness ratio (W1/d) equal to or more than 2, is arranged in the outer peripheral region 2, the recovery characteristic of the diode region 1b is improved.

Figure 18:
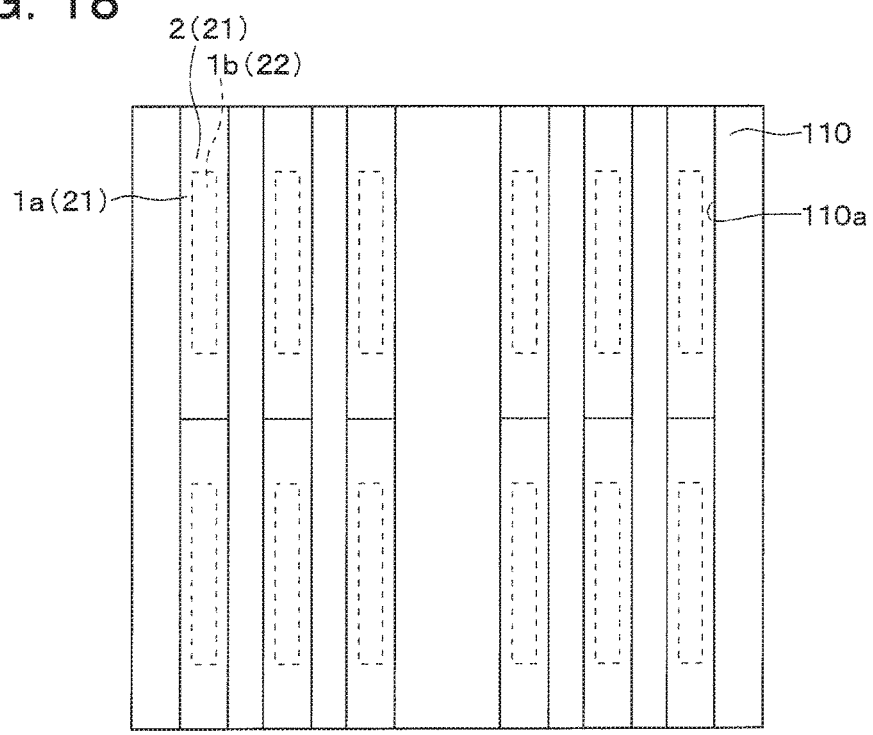
FIG. 18 is a schematic plan view of a semiconductor device according to the other embodiment of the present disclosure.

In the first to third embodiments, the damage region 24, arranged in the outer peripheral region 2, may be extended to ends of the semiconductor substrate 10 along the extension direction of the diode region 1b. In such a case, as shown in FIG. 18, a mask 110, which has stripe shaped openings 110a and shielding portions (masking portions), is employed, and a shaping process of the mask 110 is simplified.

In the first and the second embodiments, the mask 110, which has the openings 110a at portions opposing to the damage region 24, may include plural masks having the stripe shaped openings 110a and the shielding portions.

Figure 19:
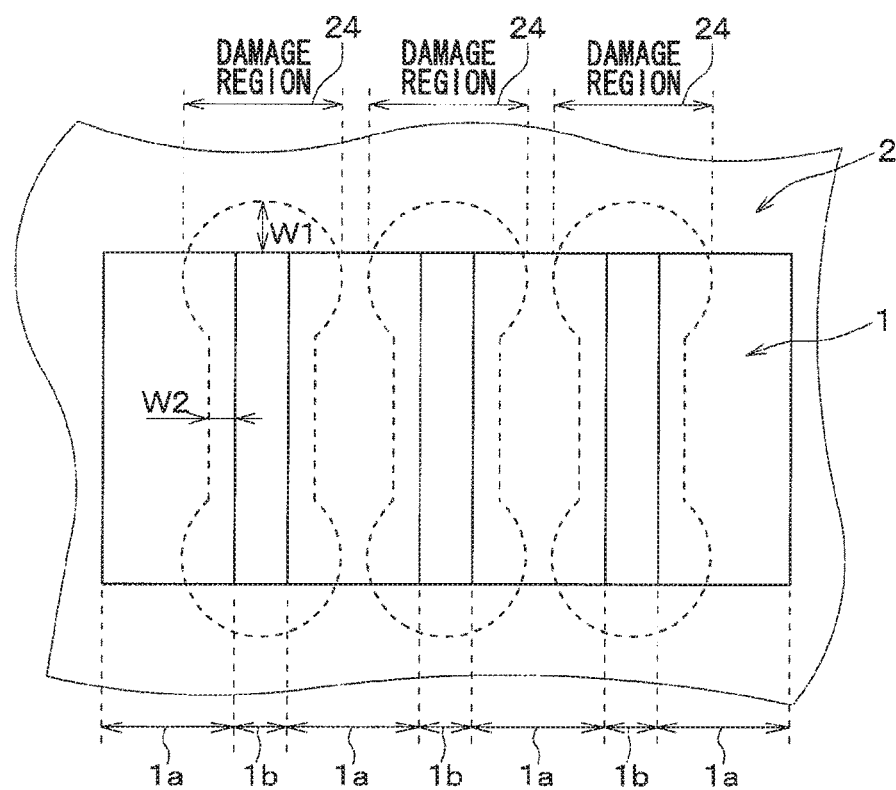
FIG. 19 is a schematic plan view illustrating a situation in which a mask is arranged on a second surface of the wafer according to the other embodiment of the present disclosure.

In the third embodiment, as shown in FIG. 19, the portions of the damage region 24, arranged at both ends of the diode region 1b in the extension direction of the diode region 1b, may have other shape such as circular shape. For example, the damage region 24 have circular shape in which the first thickness ratio (W1/d) of the center of the damage region 24 arranged in the outer peripheral region 2 is equal to or more than 2.

In the above embodiments, when the damage region 24 arranged at both ends of the diode region 1b has square shape or circular shape, the damage region 24 arranged at center portion of the diode region 1b does not have to protrude toward the IBGT region 1a.

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

What is claimed is:

1. A semiconductor device comprising:
a semiconductor substrate including
a drift layer having a first conductivity type,
a base layer having a second conductivity type and arranged on the drift layer,
a collector layer having the second conductivity type, and
a cathode layer having the first conductivity type, the collector layer and the cathode layer being arranged opposite to the base layer with respect to the drift layer, wherein:
the semiconductor substrate includes a cell region and an outer peripheral region surrounding the cell region;
the cell region includes an IGBT region operating as an IGBT element and a diode region operating as a diode element;
the IGBT region and the diode region are alternately repeated in the cell region;
the collector layer is arranged in the IGBT region and the cathode layer is arranged in the diode region;
a boundary between the IGBT region and the diode region is defined by a boundary between the collector layer and the cathode layer;
the collector layer is arranged in the outer peripheral region and is in contact with the cathode layer;
a boundary between the outer peripheral region and the diode region of the cell region is defined by the boundary between the collector layer and the cathode layer;
the semiconductor substrate further includes a damage region arranged in a surface layer portion of the semiconductor substrate;
the damage region is arranged in the diode region and a part of the outer peripheral region adjacent to the boundary between the outer peripheral region and the diode region;
a direction in which the diode region and the IGBT region are repeated is defined as an arrangement direction;

a direction perpendicular to the arrangement direction is defined as a longitudinal direction of the diode region;

the damage region protrudes from the diode region into the outer peripheral region in the longitudinal direction of the diode region; and a length, in the longitudinal direction of the diode region, of the part of the outer peripheral region, in which the damage region is arranged, is equal to or more than twice of a thickness of the semiconductor substrate.

2. The semiconductor device according to claim 1, wherein:

the damage region protrudes from the diode region toward the IGBT region along the arrangement direction;

the damage region in the IGBT region includes an end portion adjacent to an end of the diode region in the longitudinal direction;

the damage region in the IGBT region includes a center portion adjacent to a center of the diode region in the longitudinal direction; and a length, in the arrangement direction, of the end portion of the damage region in the IGBT region is greater than a length, in the arrangement direction, of the center portion of the damage region in the IGBT region.

3. The semiconductor device according to claim 2, wherein:

a hole of the drift layer in the IGBT region is recombined with an electron and eliminated at the damage region in the IGBT region.

4. The semiconductor device according to claim 1, wherein:

the IGBT region includes a damage-region-arranged portion in which the damage region is arranged, and a no-damage-region-arranged portion in which the damage region is not arranged;

the damage-region-arranged portion of the IGBT region is arranged, along a plane of the semiconductor substrate, adjacent to the boundary between the IGBT region and the diode region; and a length, in the arrangement direction, of the damage-region-arranged portion of the IGBT region is greater than or equal to the thickness of the semiconductor substrate.

5. The semiconductor device according to claim 1, wherein:

in the IGBT region, the base layer includes a channel region and a float region other than the channel region; and the semiconductor substrate further includes an emitter region having the first conductivity type and arranged in a surface layer portion of the channel region, a hole stopper layer having the first conductivity type, arranged in the float region, and dividing the float region along a thickness direction of the semiconductor substrate, and a carrier storage layer having the first conductivity type, arranged between the channel region and the drift layer, and having an impurity concentration higher than the drift layer.

6. The semiconductor device according to claim 1, wherein:

a hole of the drift layer in the outer peripheral region is recombined with an electron and eliminated at the damage region in the outer peripheral region.

7. The semiconductor device according to claim 1, wherein:

the damage region is arranged in a surface layer portion of the drift layer.

8. A semiconductor device comprising:

a semiconductor substrate including a drift layer having a first conductivity type, a base layer having a second conductivity type and arranged on the drift layer, a collector layer having the second conductivity type, and a cathode layer having the first conductivity type, the collector layer and the cathode layer being arranged opposite to the base layer with respect to the drift layer, wherein:

the semiconductor substrate includes a cell region and an outer peripheral region surrounding the cell region;

the cell region includes an IGBT region operating as an IGBT element and a diode region operating as a diode element;

the IGBT region and the diode region are alternately repeated in the cell region;

the collector layer is arranged in the IGBT region and the cathode layer is arranged in the diode region;

a boundary between the IGBT region and the diode region is defined by a boundary between the collector layer and the cathode layer;

the collector layer is arranged in the outer peripheral region and is in contact with the cathode layer;

a boundary between the outer peripheral region and the diode region of the cell region is defined by the boundary between the collector layer and the cathode layer;

the semiconductor substrate further includes a damage region arranged in a surface layer portion of the semiconductor substrate;

the damage region is arranged in the diode region and a part of the outer peripheral region adjacent to the boundary between the outer peripheral region and the diode region;

a direction in which the diode region and the IGBT region are repeated is defined as an arrangement direction;

a direction perpendicular to the arrangement direction is defined as a longitudinal direction of the diode region;

a length, in the longitudinal direction of the diode region, of the part of the outer peripheral region, in which the damage region is arranged, is equal to or more than twice of a thickness of the semiconductor substrate;

the damage region protrudes from the diode region toward the IGBT region along the arrangement direction;

the damage region in the IGBT region includes an end portion adjacent to an end of the diode region in the longitudinal direction;

the damage region in the IGBT region includes a center portion adjacent to a center of the diode region in the longitudinal direction; and a length, in the arrangement direction, of the end portion of the damage region in the IGBT region is greater than a length, in the arrangement direction, of the center portion of the damage region in the IGBT region.

9. A semiconductor device comprising:

a semiconductor substrate including a drift layer having a first conductivity type, a base layer having a second conductivity type and arranged on the drift layer, a collector layer having the second conductivity type, and a cathode layer having the first conductivity type, the collector layer and the cathode layer being arranged opposite to the base layer with respect to the drift layer, wherein:

the semiconductor substrate includes a cell region and an outer peripheral region surrounding the cell region;

the cell region includes an IGBT region operating as an IGBT element and a diode region operating as a diode element;

the IGBT region and the diode region are alternately repeated in the cell region;

the collector layer is arranged in the IGBT region and the cathode layer is arranged in the diode region;

a boundary between the IGBT region and the diode region is defined by a boundary between the collector layer and the cathode layer;

the collector layer is arranged in the outer peripheral region and is in contact with the cathode layer;

a boundary between the outer peripheral region and the diode region of the cell region is defined by the boundary between the collector layer and the cathode layer;

the semiconductor substrate further includes a damage region arranged in a surface layer portion of the semiconductor substrate;

the damage region is arranged in the diode region and a part of the outer peripheral region adjacent to the boundary between the outer peripheral region and the diode region;

a direction in which the diode region and the IGBT region are repeated is defined as an arrangement direction;

a direction perpendicular to the arrangement direction is defined as a longitudinal direction of the diode region;

a length, in the longitudinal direction of the diode region, of the part of the outer peripheral region, in which the damage region is arranged, is equal to or more than twice of a thickness of the semiconductor substrate;

the IGBT region includes a damage-region-arranged portion in which the damage region is arranged, and a no-damage-region-arranged portion in which the damage region is not arranged;

the damage-region-arranged portion of the IGBT region is arranged, along a plane of the semiconductor substrate, adjacent to the boundary between the IGBT region and the diode region; and a length, in the arrangement direction, of the damage-region-arranged portion of the IGBT region is greater than or equal to the thickness of the semiconductor substrate.

* * * * *